United States Patent [19]

Koike et al.

[11] 4,053,798
[45] Oct. 11, 1977

[54] NEGATIVE RESISTANCE DEVICE

[75] Inventors: Susumu Koike, Ibaraki; Gota Kano, Nagaoka-kyo; Iwao Teramoto, Ibaraki, all of Japan

[73] Assignee: Matsushita Electronics Corporation, Kadoma, Japan

[21] Appl. No.: 658,052

[22] Filed: Feb. 13, 1976

[30] Foreign Application Priority Data

Feb. 20, 1975 Japan .................. 50-21634
Apr. 18, 1975 Japan .................. 50-47810
Sept. 17, 1975 Japan .................. 50-112925

[51] Int. Cl.$^2$ .............. G11C 11/40; H03K 3/353; G11C 5/02; H01L 29/78

[52] U.S. Cl. .................. 307/238; 307/279; 307/288; 307/304; 357/42; 357/54; 340/173 NR

[58] Field of Search ............. 307/238, 251, 279, 288, 307/283, 286, 304; 340/173 SP, 173 PP, 173 NR; 357/42, 54

[56] References Cited

U.S. PATENT DOCUMENTS

| | | | |
|---|---|---|---|
| 3,603,811 | 9/1971 | Day et al. | 307/304 X |
| 3,843,954 | 10/1974 | Hansen et al. | 307/238 X |
| 3,906,296 | 9/1975 | Maserjian et al. | 307/238 X |
| 3,908,182 | 9/1975 | Lampe et al. | 307/238 X |

OTHER PUBLICATIONS

Ostefjells, "Negative Resistance Circuit Using Two Complementary Field Effect Transistors"; Proceedings of the IEEE, vol. 53, No. 4; Apr. 1965; p. 404.

Primary Examiner—John S. Heyman
Assistant Examiner—Larry N. Anagnos
Attorney, Agent, or Firm—Cushman, Darby & Cushman

[57] ABSTRACT

A negative resistance device formed by series-connection of a complementary pair of insulated gate type FETs (field effect transistors), the source of the FETs being connected to each other and the gates of each of the FETs being connected to the respective drain of the other FET at least one FET having a double layered gate insulation film under the gate electrode, thereby forming a non-volatile memory element. The negative resistance device acquires or loses negative resistance characteristics by responding to signals to the gates, thereby memorizing the signals and resulting in a highly efficient memory which requires little power in writing-in, erasing and memory-holding.

19 Claims, 16 Drawing Figures

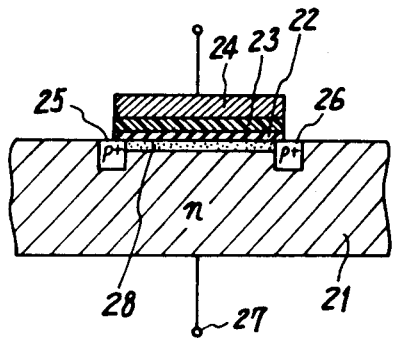
FIG. 1 (P-channel MNOS FET)
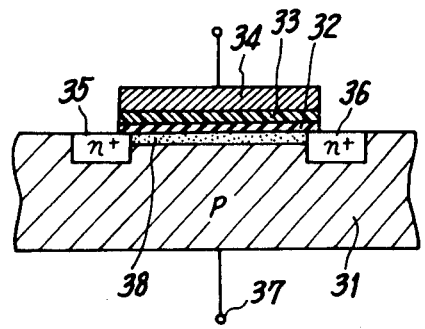
FIG. 2. (n-channel MNOS FET)
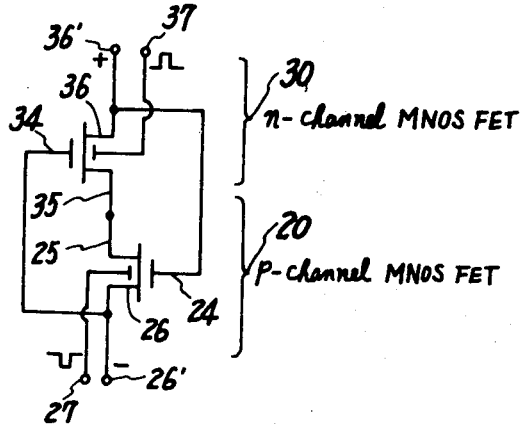
FIG. 3. b
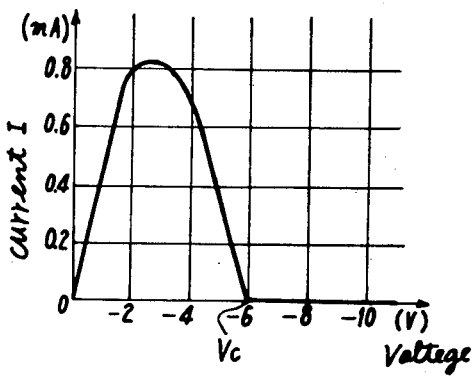
FIG. 4.
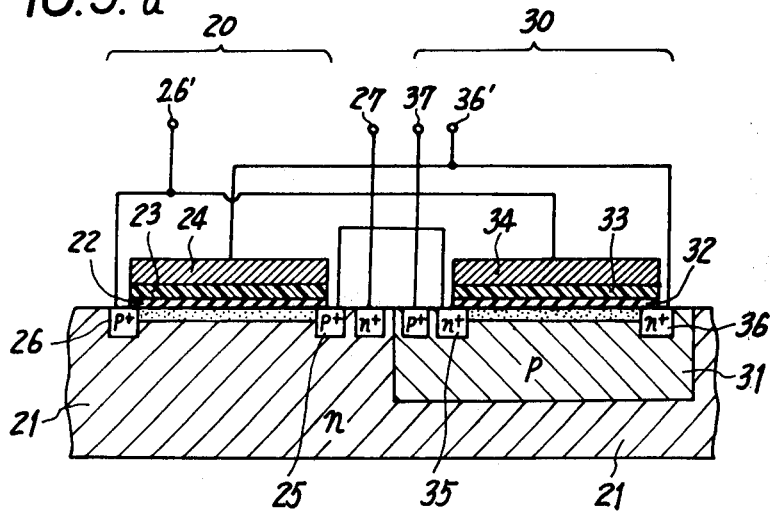
FIG. 3. a

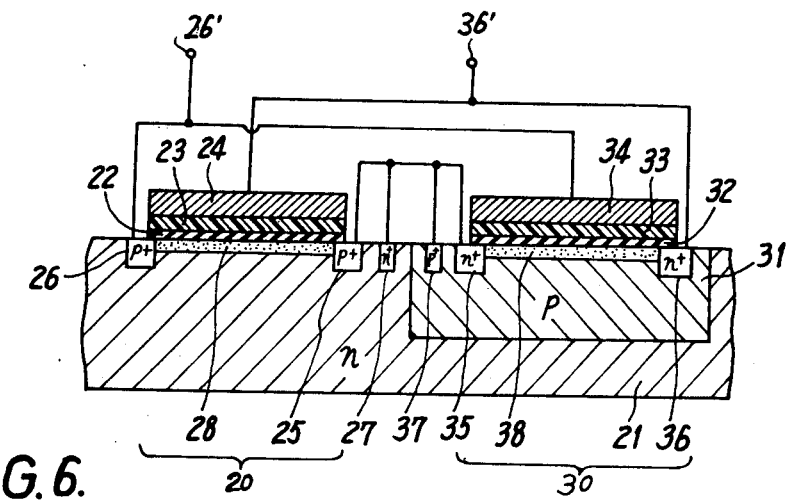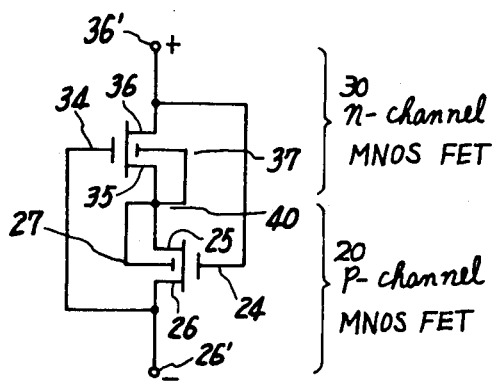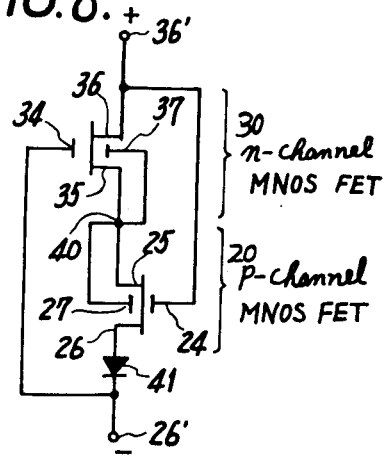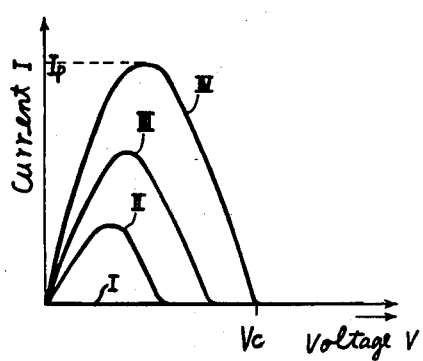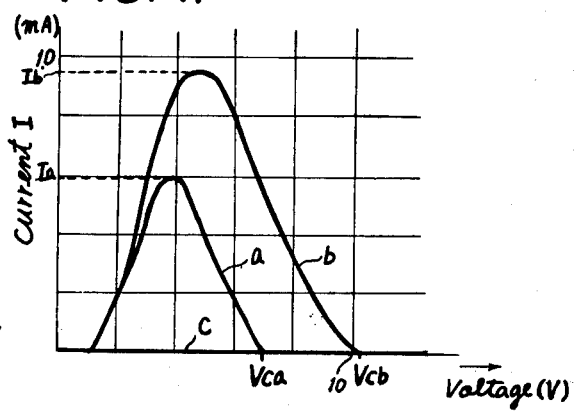

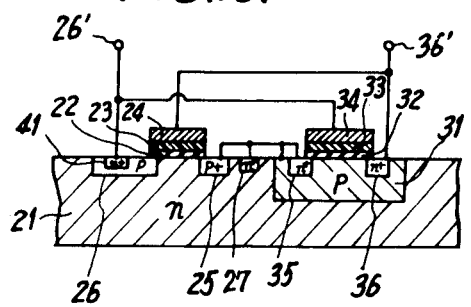
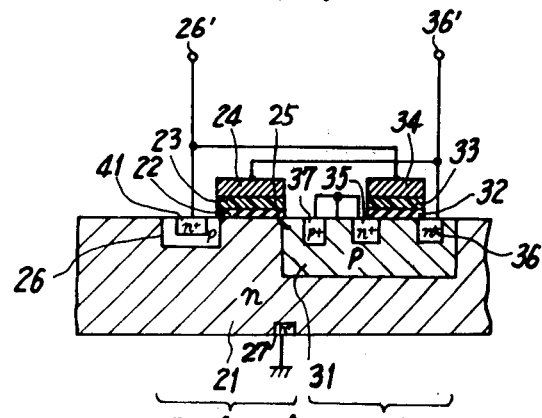
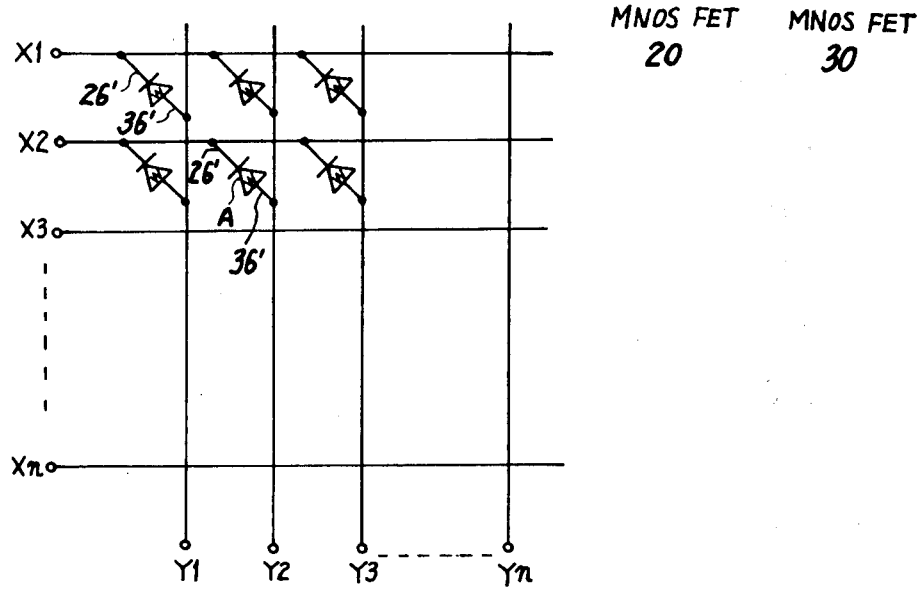
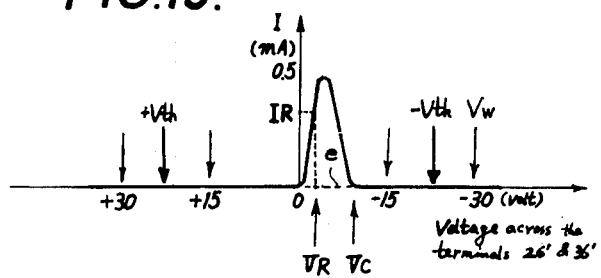

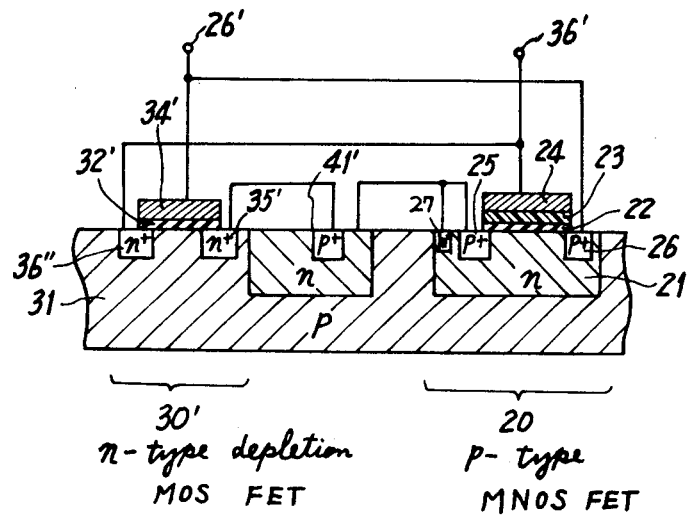
FIG.14.a
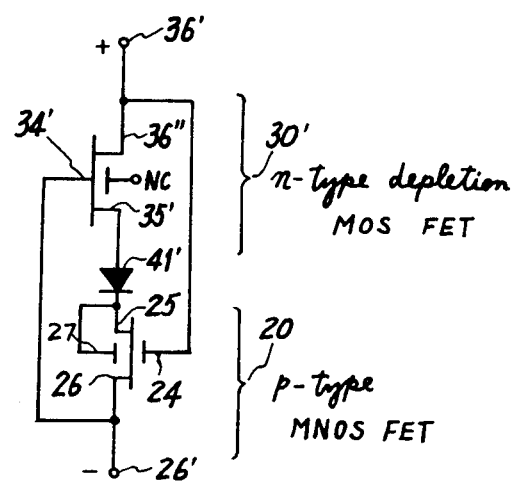
FIG.14.b

4,053,798

NEGATIVE RESISTANCE DEVICE

BACKGROUND OF THE INVENTION

Negative resistance characteristics have been attained by a complementary pair of FETs (field effect transistors) connected in series by their sources to each other and connected by their gates to the drain of the other as described in the article entitled "Synthesis of Electronic Bistable Circuits" by L. O. Hill, D. O. Pederson and R. S. Pepper, in IEEE TRANSACTIONS ON CIRCUIT THEORY, volume CT-10, 1963.

The device introduced in said article was formed with an n-channel FET and a p-channel FET connected in the abovementioned way, and was to perform a dynatron type negative resistance (Λshaped current-voltage)characteristic. Such negative resistance characteristic can be obtained by the aforementioned connection a complementary pair (a pair of opposite conductivity types) of depletion mode FETs, for instance, a conplementary pair of junction type FETs, a complementary pair of MIS (metal-insulator-semiconductor) type FETs or a junction type FET and a MIS type FET of the other conductivity type.

In general, such negative resistance devices are useful in switching, oscillation, amplification, memorying, etc. One of the most important uses of the device would be for integrated memories. In such integrated memories, in view of the density of the integration, the combination of the MIS type FETs is advantageous. However, since it is difficult to realize a p-channel FET in the depletion mode, it has been difficult to form the negative resistance device by means of a complementary pair of the MIS type FETs in monolithic a substrate. The reason of such difficulty is an that $SiO_2$ which gate film is formed on an n-type Si substrate, while making the FET, the $SiO_2$ film is usually contaminated by impurities such as $Na^+$ ions, etc. Accordingly the $SiO_2$ gate film becomes positively charged, and hence, electrons are accumulated at the semiconductor surface underneath the $SiO_2$ gate film. Therefore it is easy to realize a p-channel PET of enhancement mode, but that of depletion mode is difficult.

SUMMARY OF THE INVENTION

This invention relates to a negative resistance device comprising a complementary pair of FETs of depletion mode, wherein the negative resistance characteristic is controlled by gate potentials of the FETs, and at least one of the FETs is a non-volatile memory device having a double gate insulator structure, for instance, the metal-nitride oxide-semiconductor structure.

This invention concerns a negative resistance device comprising a complementary pair of FETs of depletion mode, which hold electric charges accumulated in the gate insulation films and thereby function as a non-volatile memory device.

BRIEF DESCRIPTION OF THE DRAWING FIGS.

1 and 2 are schematic sectional views of p-channel and n-channel MNOS FETs, respectively.

FIGS. 3a, 3b and 4 are schematic sectional view, circuit diagram and current-voltage characteristic diagram, respectively, of a negative device embodying the present invention. FIGS. 5, 6 and 7 are schematic sectional view, circuit diagram and current-voltage characteristic diagram, respectively, of another negative resistance device embodying the present invention.

FIGS. 8, 9 and 10 are circuit diagram, current-voltage characteristic and schematic view, respectively of still another negative resistance device embodying the present invention.

FIG. 11 is schematic sectional view of another structural example of the device having the circuit of FIG. 8.

FIGS. 12 and 13 are circuit diagram and current-voltage characteristic diagram of a memory matrix embodying the present invention.

FIGS. 14a and 14b are schematic sectional view and circuit diagram of still another negative resistance device of the present invention.

DETAILED DESCRIPTION OF THE INVENTION

FIG. 1 and FIG. 2 show schematic sectional views of p-channel and n-channel MNOS type FETs, respectively.

As shown in FIG. 1, the first FET of p-channel MNOS type is formed by disposing thin $SiO_2$ film 22, $Si_3N_4$ film 23 and metal film 24 as a gate electrode on an n-type silicon substrate 21. A $p^+$-type region 25 as a source region and another $p^+$-type region 26 as a drain region are formed on both sides of the area underneath the abovementioned films 22, 23, 24. The abovementioned FET initially is in enhancement mode. However, when a positive voltage with respect to the substrate 21 is impressed on the gate electrode 24, by means of the electric field formed by the voltage, electron charges are injected and stored into the double layered insulation films, especially at traps distributed at the interface part between the $Si_3N_4$ film 23 and the thin $SiO_2$ film 22. This is caused by electrons injected through the thin $SiO_2$ film, which is generally 20 to 50 A thick. By means of a tunnel effect under the electric field, the electrons are captured by the traps at the interface, and are retained there even after removal of the electric field. The accumulation of the electrons in the insulation films 22 and 23 is equivalent to an impression of a negative voltage at the gate electrode 24 with respect to the substrate electrode 21. Therefore, positive holes, are induced in such part of the surface of the substrate underneath the abovementioned double insulator gate, so that the surface conductivity type of the substrate is inverted. As a result, a p-channel layer 28 is formed by the abovementioned voltage impression.

Now, by means of the temporary impression of the positive voltage to the gate 24, this p-channel type FET can work in depletion mode.

As shown in FIG. 2, the second FET of n-channel MNOS type is formed by disposing thin $SiO_2$ film 32, $Si_3N_4$ film 33 and metal film 34 to form a gate electrode on a p-type silicon substrate 31. An $n^+$-type region 35 as source region and another $n^+$-type region 36 as drain region are formed on both sides of the area underneath the abovementioned films 32, 33, 34. The abovementioned n-channel type FET initially works in enhancement mode, too. When a negative voltage with respect to the substrate 31 is impressed in the gate electrode 34, by means of the electric field formed by the voltage, positive holes are injected and stored in the double layered insulation films, especially at the traps distributed at the interface part between the $Si_3N_4$ film 33 and the $SiO_2$ film 32. This is caused by positive holes injected through the thin $SiO_2$ film, which is generally 20 to 50A thick. By means of tunnel effect under the electric field, the holes are captured by the traps at the interface, and are retained even after removal of the electric field. The accumulation of the positive holes in the insulation films 22 and 23 is equivalent to an impression of a positive voltage at the gate electrode 34 with respect to the substrate 31. Therefore electrons, i.e., negative charges, are induced in such part of the substrate underneath the abovementioned double gate insulator, so that the surface conductivity type of the substrate is inverted. As a result, an n-channel layer 38 is formed by the abovementioned voltage impression.

Now, by means of the temporary impression of the negative voltage on the gate 34, this n-channel FET can work in depletion mode.

In the first example of the present invention, the abovementioned p-channel MNOS type FET and n-channel MNOS type FET are formed in a monolithic wafer as shown in FIG. 3a, wherein the p-channel FET 20 is formed in the left part of the n-channel substrate 21, and the n-channel FET 30 is formed in a p-type well region 31 formed by thermal diffusion in the right part of the substrate 21. The sources 25 and 35 are connected to each other by known connecting means. The gate electrodes 24 and 34 of the FETs 20 and 30 are connected to the drain regions 36 and 26 respectively, by known connecting means. The substrate 21 and 31 are connected to the terminals 27 and 37, respectively.

As is known, in general, the source region and the drain region of an FET are electrically equivalent to each other, and therefore, we can call either one of the pair of regions 25 and 26 and either one of the pair of regions 35 and 36 as sources and the other ones as drains.

FIG. 3b shows a circuit diagram of the device shown in FIG. 3a.

The method of forming the device of FIG. 3a is as follows:

First, on a part of a principal (100) surface of an n-type silicon substrate 21 having surface impurity concentration of $10^{15}$ to $10^{17}$ atoms/cm$^3$, a p-type well 31 is formed so as to have a surface impurity concentration of $10^{15}$ to $10^{17}$ atoms/cm$^3$ by known thermal diffusion methods. Then, p+-type regions 25 and 26 having impurity concentrations of $10^{19}$ to $10^{20}$ atoms/cm$^3$ and n+-regions 35 and 36 having impurity concentration of $10^{19}$ to $10^{20}$ atoms/cm$^3$ are formed by known diffusion processes. The SiO$_2$ films 22 and 32 are formed by known thermal oxidation methods so as to have thicknesses of 10 to 30 A. The Si$_3$N$_4$ films 23 and 33 are formed by flowing SiH$_4$ gas and NH$_3$ gas so as to have thicknesses of 600 to 1000 A. Connections between the gate electrodes 24 and 34 the alternate drains 36, and 26 are connections between each of sources 25 and 35 are made by known vapor depositions of metal strips.

After impressing a pulse signal of +25 volts on the p-type well 31 with respect to the gate 34 through the terminals 37 and 26', and a pulse signal of −25 volts on the n-type substrate 21 with respect to the gate 24 through the terminals 27 and 36', respectively, each pulse having a width of 1 to 10 mili-seconds, a variable input voltage is impressed across the terminals 36' and 26'. Then, the characteristic between input voltage and the current flowing through the terminals 36' to 26' indicates a Λ (Greek letter lambda) shaped negative resistance (dynatron) characteristic as shown in FIG. 4.

Since the dynatron-type characteristic is attained by the depletion mode of the FETs 20 and 30 produced by the application of the pulse signals to the terminals 37 and 27, the dynatron-type characteristic is erased by impressing specified pulse signals of opposite polarity to the abovementioned signals to the terminals 37 and 27. Such erasing signals must have specified voltages of greater absolute values than threshold values which permit the reverse charge transfer from the insulator to the semiconductor. By means of the erasing signals, both MNOS FETs turn to the enhancement-mode, so that, the dynatron-type characteristics are erased.

FIG. 5 and FIG. 6 show schematic sectional view and circuit diagram respectively of another example, In this example, the substrate terminals 27 and 37 are connected in common to the point 40 of common connected sources 25 and 26, and other parts are identical to the foregoing example. This example operates as a two terminal device wherein both MNOS FETs are made in depletion mode thereby giving the negative resistance characteristic only by impressing a negative pulse to the terminals 26' with respect to the terminal 36'.

Operation of the example of FIGS. 5 and 6: A negative voltage pulse is impressed across the terminals 26' and 36' in a manner that the terminal 26' is negative with respect to the terminal 36'. Then, in the n-channel MNOS FET 30, the gate 34 becomes negative with respect to the substrate 37, and therefore, the positive holes pass through the thin SiO$_2$ film 32 as described referring to FIG. 2 and a positive charge is accumulated in the trap level at the interface between the SiO$_2$ film 32 and the Si$_3$N$_4$ film 33. Accordingly, the n-channel MNOS FET 30 becomes a depletion mode device. At the same time, in the p-channel MNOS FET 20, the gate 24 becomes effectively positive with respect to the substrate 27, and therefore the electrons are injected through the thin SiO$_2$ film 22 as described referring to FIG. 1, and a negative charge is accumulated at the interface between the SiO$_2$ film 22 and Si$_3$N$_4$ film 23. Accordingly the p-channel MNOS FET 20 becomes depletion mode device. Thus the device of FIGS. 5 and 6 is made into depletion mode by only impressing a specified negative voltage to the terminal 26' with respect to the terminal 36', and the depletion mode is retained even after removal of the voltage.

FIG. 7 shows voltage-current characteristics of the device of FIGS. 5 & 6, wherein curves I, II, III and IV represent negative resistance characteristics for various degrees of electric charges in the insulation films. The greater the amount of the accumulated charge, the greater the peak current Ip and the higher the cut-off voltage Vc become. Namely, by impressing a D.C. voltages across the terminals 26' and 36', various negative resistance characteristics appear. When a specified opposite voltages to the initially impressed voltage is impressed across the terminals 26' and 36', then the once accumulated charges in the interfaces are removed and both MNOS FETs return to enhancement mode. Namely, the negative resistance characteristic disappears. The opposite voltage must be greater than a specified threshold value.

Thus by impressing a D.C. voltage across the terminals 26' and 36' a signal "1" is written in the form of the occurence of negative resistance characteristic, and by impressing the inverse D.C. voltage across the terminals 26' and 36', the signal "1", i.e., the negative-resistance characteristic is erased. In the examples of FIGS. 5 and 6, the voltages of writing D.C. pulses are −25 to −40 volts, the pulse widths are 1 to 10 mili-seconds, the cut-off voltages Vc and 3 to 13 volts and the peak currents are 0.1 to 1 mili-ampere.

FIG. 8 shows another example wherein a diode 41 is connected by its anode to the drain 26 of the p-channel MNOS FET 20 and by its cathode to the gate 34 of the n-channel. MNOS FET 30 and a first terminal 26', and the other parts are identical to the example of FIGS. 5 and 6. Fig. 10 shows a schematic sectional view of the semiconductor device of FIG. 8, wherein the diode 41 connected between the terminal 26 and the drain 26 of the p-channel MNOS FET 20 is formed in the p-type diffused region 26, a part of which lies underneath the insulation films 22 & 23 of the gate electrode 24 and in which an N+ region 41 is formed.

Operation of the example of FIGS. 8 & 10: A negative voltage pulse is impressed across the terminals 26' and 36' in a manner that the terminal 26' is negative with respect to the terminal 36'. Since the diode 41 is in the forward direction for the drain current of the p-channel MNOS FET 20, the voltage drop across the anode and cathode of the diode 41 is as small as about 1 volt, and the common connected substrates 27 and 37 have an intermediate potential between the potentials of terminals 26' and 36'. Then, in the n-channel MNOS FET 30, the gate 34 becomes negative against the substrate 37, and therefore, the n-channel MNOS FET 30 shifts to depletion mode as in the example of FIGS. 5 & 6. At the same time, in the p-channel MNOS FET 20, the gate 24 becomes positive against the substrate 27, and therefore, the p-channel MNOS FET 20 also shifts to depletion mode as in the example of FIGS. 5 & 6. Thus, the device acquires a negative resistance characteristic which represents a signal indicating for instance, "1 is memorized".

The voltage-current characteristic between the terminals 26' and 36' of the device of FIGS. 8 & 10 is shown by the curves of FIG. 9, wherein the peak current value ($I_a$, $I_b$) and cut-off voltage ($V_{ca}$, $V_{cb}$) changes in response to the electric charges in the insulation films, which charges are responding to the height (V1) and width of the pulse voltage impressed across the terminals 26' and 36'. In FIG. 9, curve "a" represents the characteristic for the pulse of V1= −25V, and curve "b" for the pulse of V1= −50V. Both pulse widths are 1 second.

The memory written in the abovementioned way by making both MNOS FETs in depletion mode can be erased by simply impressing a pulse of opposite polarity with a specified value across the terminals 26' and 36', or by impressing a D.C. pulse of the polarity opposite to the one previously impressed for memorizing.

In comparison with the example of FIGS. 5 & 6, in the example of FIGS. 8 & 10 diode 41 is cut off when the inverse voltage for erasing is impressed across the terminals 26' and 36'. Accordingly, substantially no current is required in erasing, and therefore, substantially no power is required for erasing. When the erasing signal, i.e., a specified negative voltage to the terminal 36' with respect to the terminal 26', is impressed, the diode 41 becomes cut off because of reverse-biased voltage. Therefore, though both MNOS FETs are in depletion mode which is in the state to allow a current to flow through a path connecting the drain 36, the source 35, the source 25 and the drain 26, the current is cut off by the diode 41. By means of the impressed negative voltage at the drain 36 with respect to the gate 34, the positive charge (holes) previously accumulated in the double layered films 32, 33 are removed into the p-type well part 31 and the n-channel disappears. Therefore the n-channel MNOS FET is changed back to the enhancement mode. On the other hand, owing to the reversely biased diode 41, the voltage of the substrate 27 becomes close to that of the terminal 36', and accordingly, substantially no voltage is impressed between the gate 24 and the substrate 27. Therefore, the p-channel MNOS FET 20 is not changed back to the enhancement mode. However, now in the circuit diagram of FIG. 8, as a result of the n-channel MNOS FET 30 returning to the enhancement mode, the negative characteristic between 26' and 36' is lost thereby indicating the erased state (zero current) as shown in the curve c of FIG. 9. Another example can be formed by inserting the diode 41 between the source 35 connected with the gate 37 and the source 25 connected with the gate 27 of the FETs 30 and 20, respectively. In such device, when a negative voltage is impressed on the terminal 36' with respect to the terminal 26', the voltage of the substrate 27 becomes close to that of the terminal 26' which is then at a positive voltage and accordingly, the gate 24 of the p-channel MNOS FET 20 becomes deeply negative with respect to the substrate 27. Hence, the p-channel MNOS FET 20 turns into enhancement mode. The same applies also to the n-channel MNOS FET 30, too. Accordingly the negative resistance device is erased. In the abovementioned negative resistance devices with the diode 41, no current flows between the terminal 26' and 36' when the memory of the negative resistance characteristic is erased. Thus by means of the insertion of the diode 41, the erasing can be done without consuming substantial power. Naturally, due to insertion of the diode 41, the rise-up voltage of the Λ (Greek lambda letter) shaped negative resistance characteristic curve shifts rightward in comparison with the curves a FIG. 7 to the extend of small forward voltage drop across the diode 41 as shown by the curves of FIG. 9.

FIG. 11 shows another structural example for realizing the circuit of FIG. 8, in which the substrate 21 is grounded. In this example, the left end part of the p-type well region 31 of the n-channel MNOS FET 30 serves also as a source region 25 of the p-channel MNOS FET, in order to save space for attaining a higher density of integration.

FIG. 12 shows one example of a diode matrix comprising the abovementioned device of FIGS. 6, 8, 10 or 11 as two-terminal devices, in which the devices can be connected like ordinary diodes of the known diode matrix. For instance, terminals 26' are connected to the X address lines, i.e., X1, X2, X3,. . ., and terminals 36' are connected to the Y address lines i.e., Y1, Y2, Y3, . . . . This matrix memorizes "1" by writing in the unit cells by giving a specified voltage from selected X and Y lines making the selected unit assume the state of the negative resistance characteristic.

Memorizing operation of FIG. 12 is described in more details referring to FIGS. 12 & 13. In the matrix of FIG. 12, in order to write the memory unit cell A, −30 volts is impressed to the address line X2, 0 volt is impressed to the address line Y2, and −15 volts and −30 volts are impressed to other X lines, namely X1, X3, . . . X$n$ and other Y lines, namely Y1, Y3, . . . Y$n$, respectively. By the abovementioned impression, a writing signal Vo of FIG. 13 is impressed to the memory unit cell A. In FIG. 13, the ordinate indicates current and the abscissa indicates voltage impressed to the terminal 26' with respect to the terminal 36' of FIGS. 6, 8, 10 or 11. As shown by FIG. 13, by the impressing of the voltage Vw, the device A acquires negative-resistance characteristic. This state is defined as the written state or the state of memory "1". Whether the previous state has been memory "1" or memory "0" (the state of not being written) prior to the abovementioned memorizing, no substantial current flows into the unit cell A in the memorizing action. During the memorizing action, in other unit cells connected in X2 line both terminals are impressed by the same −30 volts, and therefore, no memorying is made. Also in other unit cells connected to Y2 line, the terminals 36' is impressed by +15 volts with respect to the terminal 26', and therefore, no memorying is made. In the unit cells connected to other Y lines than the Y2 line and to other X lines than the X2 line, their termials 36' is impressed by +15 volts with respect to the terminal 26'. As seen from the chart of FIG. 13, in any of the unit cells the current is zero. The reason why is that generally an MNOS FET has a certain threshold value Vth (e.g. 20v) necessitated in making the tunnel effects in writing and erasing, and therefore, a voltage with absolute value smaller than the threshold value does not affect the memorized states. Therefore, in the abovementioned matrix, only the unit cell A which is impressed by −30 volts is written, and other cells are not written nor erased.

In case the unit cell has been erased, the negative resistance characteristic is lost and the current is zero as indicated by the dotted line e in FIG. 13. Therefore, the writing power is substantially zero.

Next, an erasing of a specified unit cell is made by impressing a specified inverse voltage to it. For instance, in order to erase the unit cell A, 0 volt to the address line X2 and −30 volts to the adress line Y2 are impressed, and −30 volts to other X lines, namely X1, X3, ... Xn, and −15 volts to other Y lines, namely Y1, Y3, ... Yn are impressed. Therefore, −30 volts is impressed to the terminal 36' with respect to the terminal 26'. Since this voltage of −30 volts is in excess of the threshold value of, for instance −20 volts, the memory is erased. Other unit cells than the unit cell A receive a voltage of 0 volt, −15 volts, but all of them have smaller absolute value than the threshold value. And therefore, no other unit cells are changed in their memories. Moreover, substantially no cover flows in the unit cells in this erasing action, either.

Reading of the memorized information is made by impressing a reading voltage VR, having a value in the range of positive gradient of Λ curve in the voltage-current characteristic curve of FIG. 13. When the unit cell is in the written (memorized) state, the curve has the Λ shaped part (as shown by the solid line), and therefore, by impressing the reading voltage VR, a reading current IR is obtainable. On the contrary, when the unit cell is in the erased state, there is no Λ shaped part in the curve (as shown by the dotted line e), and accordingly, no current is obtainable.

In one actual example, by reading of the memory of the unit cell A can be easily made by impressing:

Reading voltage: 3V
X2 address line: −3V
X lines other than X2: 0V
Y2 address line: 0V through a reading resistor (not shown)
Y lines other than Y2: −3V.

As described in the aforementioned embodiments, the device of the present invention is simple in structure, and therefore can be highly integrated, and hence, is useful especially in making two-dimensional structures, for instance, in use as a memory matrix.

Furthermore, this device has such a superior merit that power consumption is very low in writing and erasing, especially in the examples with the series connected diode.

Though the abovementioned examples are formed with a complementary pair of MNOS FETs, other examples such as those comprising one MNOS FET and one ordinary depletion mode FET can be made. FIGS. 14a and 14b show one such example as having p-channel MNOS FET 20 and n-channel depletion MOS FET 30', and a diode 41' in series between the sources 35' and 25 of the FETs 30' and 20.

Furthermore, other non-volatile memory transistors than MNOS FET can be used to constitute the device of the present invention. For instance, non-volatile memory devices comprising $Al_2O_3$-$SiO_2$ double layered films or non-volatile memory device of floating gate structure which comprises an $SiO_2$ film containing electrode region(s) of ploycrystalline Si therein can be used.

What is claimed is:

1. A negative resistance device comprising:
    a complementary pair of FETs, each of which operates in depletion mode and includes a first pair of regions defining a source and drain and a second gate region and which are connected in series with each other by a first region of one FET connected to a first region of the other FET and by a gate region of each FET connected to at least one first region of the other FET, and
    a pair of external terminals respectively connected to a first region of each of said FETs which is not connected to the other FET
    at least one of said FETs being an insulated gate type non-volatile memory device comprising, at the gate region, an insulation film which stores electric charge therein to memorize in non-volatile manner.

2. A negative resistance device as in claim 1, wherein both FETs are said insulated gate type non-volatile memory devices.

3. A negative resistance device as in claim 1, wherein said at least one of said FETs is the insulated gate type non-volatile memory device in which electric charge is brought into the insulation film.

4. A negative resistance device as in claim 1, wherein said at least one of said FETs is an insulated gate type non-volatile memory device which has metal film as gate electrode, a first insulation film disposed underneath said metal film, and a second insulation film of different kind from and disposed underneath said first insulation film.

5. A negative resistance device as in claim 4 wherein said first insulation film is of $Si_3N_4$ and said second insulation film is of $SiO_2$.

6. A negative resistance device as in claim 1, wherein said complementary pair of FETs are made in a single semiconductor wafer.

7. A negative resistance device as in claim 1, wherein said at least one of said FETs of insulated gate type non-volatile memory device comprises a source electrode, a drain electrode, a gate electrode and a substrate electrode, said substrate electrode being connected to the connection point where both FETs are connected to each other.

8. A negative resistance device as in claim 1, which further comprises a diode inserted in series with one of said first regions.

9. A negative resistance device as in claim 8, wherein both FETs are said insulated gate type non-volatile memory devices.

10. A negative resistance device as in claim 8, wherein said at least one of said FETs is the insulated gate type non-volatile memory device in which electric charge is brought into the insulation film.

11. A negative resistance device as in claim 8, wherein said at least one of said FETs is an insulated gate type non-volatile memory device which has metal film as gate electrode, a first insulation film disposed underneath said metal film, and a second insulation film of different kind from and disposed underneath said first insulation film.

12. A negative resistance device as in claim 11, wherein said first insulation film is of $Si_3N_4$ and said second insulation film is of $SiO_2$.

13. A negative resistance device as in claim 8, wherein said complementary pair of FETs are made in a single semiconductor wafer.

14. A negative resistance device as in claim 8, wherein said at least one of said FETs of insulated gate type non-volatile memory device comprises a source electrode, a drain electrode, a gate electrode and a substrate electrode, said substrate electrode being connected to the connection point where both FETs are connected to each other.

15. A negative resistance device as in claim 8, wherein one of said FETs is formed in one part of semiconductor substrate, and the second other FET is formed in a well having opposite type conductivity to the semiconductor substrate, and said diode is formed in a part of a first region of the first FET.

16. A negative resistance device as in claim 1, wherein a diode is inserted between said first regions of said FETs which are series connected.

17. A negative resistance memory matrix comprising a plurality of devices connected between horizontal and vertical lines, each device comprising:
 a complementary pair of FETs, each of which operates in depletion mode and includes a first pair of regions defining a source and drain and a second gate region and which are connected in series with each other by a first region of one FET connected to a first region of the other FET and by a gate region of each FET connected to at least one first region of the other FET, and
 a pair of external terminals respectively connected to a first region of each of said FETs which is not connected to the other FET,
 at least one of said FETs being an insulated gate type non-volatile memory device comprising, at the gate region, an insulation film which stores electric charge therein to memorize in non-volatile manner,
 memorizing in each device being carried out by a D.C. writing voltage of a specified polarity and amplitude exceeding a threshold value, erasing by a D.C. voltage of opposite polarity to that of said writing voltage and amplitude exceeding said threshold value and reaching by other voltages of the same polarity as said writing voltage and amplitude such that a current is obtained in the Λ letter voltage-current characteristic of the device.

18. A negative resistance device as in claim 17, wherein said at least one of said FETs of insulated gate type non-volatile memory device comprises a source electrode, a drain electrode, a gate electrode and a substrate electrode, said substrate electrode being connected to the connection point where both FETs are connected to each other.

19. A negative resistance device as in claim 17, which further comprises a diode inserted in series with one of said first regions.

* * * * *